United States Patent
Nakamura

(10) Patent No.: US 7,130,577 B2
(45) Date of Patent: Oct. 31, 2006

(54) LOW NOISE CONVERTER EMPLOYED IN SATELLITE BROADCAST RECEPTION SYSTEM AND RECEIVER APPARATUS

(75) Inventor: Makio Nakamura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 456 days.

(21) Appl. No.: 10/413,549

(22) Filed: Apr. 15, 2003

(65) Prior Publication Data
US 2003/0194985 A1    Oct. 16, 2003

(30) Foreign Application Priority Data
Apr. 15, 2002    (JP)    ............... 2002-112387

(51) Int. Cl.
*H04H 1/00*    (2006.01)
(52) U.S. Cl. .............. 455/3.02; 455/302; 455/317
(58) Field of Classification Search ............... 455/3.01, 455/3.02, 296, 295, 302, 313, 317, 323; 725/63, 725/68, 69
See application file for complete search history.

(56) References Cited

U.S. PATENT DOCUMENTS

| 5,959,592 A | 9/1999 | Petruzzelli |
| 6,373,445 B1 * | 4/2002 | Kuno .................. 343/786 |
| 6,941,106 B1 * | 9/2005 | Chen .................. 455/3.02 |

* cited by examiner

*Primary Examiner*—Nguyen T. Vo
(74) *Attorney, Agent, or Firm*—Birch, Stewart, Kolasch & Birch, LLP

(57) ABSTRACT

A reception frequency band is selected at 11.7 GHz–12.2 GHz, the local oscillating frequencies of local oscillators are determined at 10.75 GHz and 13.85 GHz, respectively, and each intermediate frequency band is selected at 950 MHz–1450 MHz and 1650 MHz–2150 MHz, respectively, so that the harmonic component of the frequency difference between local oscillation signals output from each local oscillator is not present in the frequency band of each intermediate frequency signal output from each mixer and in the reception band of polarization signals applied to input terminals.

20 Claims, 9 Drawing Sheets

LOW NOISE CONVERTER EMPLOYED IN SATELLITE BROADCAST RECEPTION SYSTEM AND RECEIVER APPARATUS

BACKGROUND OF THE INVENTION

1. Field of the Invention

The present invention relates to low noise converters, particularly a low noise converter employed as an LNB (Low Noise Block down-converter) incorporated in a receiver of an antenna for satellite signal transmission/reception, converting two input signals differing in polarization into signals of different intermediate frequencies (IF) for transmission to an indoor unit (indoor receiver), and a receiver apparatus including such a low noise converter.

2. Description of the Background Art

FIG. 14 is a block diagram showing a first conventional LNB. The LNB of FIG. 14 is directed to satellite broadcasting/communication reception that allows reception of a plurality of polarized waves, employed for receiving the Ku band satellite signals of the United States.

According to FIG. 14, a reception signal of input frequency 11.7 GHz–12.2 GHz is divided into a horizontal polarization signal and a vertical polarization signal by a cross polarization separator (not shown), which are applied to input terminals 1 and 2, respectively. The signals applied through these two input terminals are respectively picked up by an antenna probe. Each input signal is amplified with low noise by low noise amplifiers LNA 3–6, and then passes through BPFs (Band Pass Filter) 7 and 8 functioning to pass through signals of a desired frequency band and removing signals of an image frequency band.

Then, one signal is applied to a mixer circuit (mixer) 11 together with an oscillation signal of 10.75 GHz output from a local oscillator 209. At mixer 11, the signal is frequency-converted into a signal of an intermediate frequency band-of 950 MHz–1450 MHz. The other signal is applied to a mixer 12 together with an oscillation signal of 10.15 GHz output from a local oscillator 210. At mixer 12, the signal is frequency-converted into a signal of the intermediate frequency band of 1550 MHz–2050 MHz. The signals of these two bands are combined at a combine circuit 215 and transmitted to an IF amplifier 16 to be amplified so as to have appropriate noise and gain characteristics for output from one IF output terminal 17.

IF output terminal 17 receives via a coaxial cable a direct current voltage superimposed on an output signal from an indoor receiver (not shown). A power supply circuit 18 converts that direct current voltage into a predetermined potential, which is applied to respective circuits.

FIG. 15 is a block diagram of a second conventional LNB. The LNB of FIG. 15 receives at input terminals 1 and 2 two signals differing in polarization as signals from a satellite having the frequency of 12.2–12.7 GHz. When the signals from a satellite correspond to a right-hand polarized wave and a left-hand polarized wave, the signals pass through a transducer connected at a preceding stage to the converter to convert the two circularly-polarized waves into two linearly-polarized waves, which are applied to the two input terminals of the converter.

The subsequent operation is similar to that of the first conventional LNB. The signals pass through low noise amplifiers 3–6 and BPFs 7 and 8 which are the band filters for image suppression. Then, one is applied to mixer 11 to which a local oscillation signal having the oscillating frequency of 11.25 GHz is applied from a local oscillator 209A. The other is transmitted to mixer 12 to which a local oscillation signal having an oscillating frequency of 14.35 GHz is applied from a local oscillator 210A. The signals are further transmitted to a LPF (Low Pass Filter) 13 having a transmitting frequency of 950–1450 MHz and to an HPF (High Pass Filter) 14 having a transmitting frequency of 1650–2150 MHz, respectively. The signals of these bands are combined at combine circuit 215, and then applied to IF amplifier 16 to be amplified and output from IF output terminal 17, likewise the first conventional LNB.

In the LNB of FIG. 14, harmonic components of 1200 MHz and 1800 MHz that are two times and three times, respectively, the frequency difference of the local oscillation signals output from the two local oscillators 209 and 210 (10.75 GHz–10.15 GHz=0.6 GHz) are included as spurious harmonic components in the IF bands of 950 MHz–1450 MHz and 1550 MHz –2050 MHz, respectively. Some measures must be taken to suppress this level.

Possible measures include enhancing the shields of the two local oscillators 209 and 210 as well as the two mixers 11 and 12. However, this approach will render the structure complex and increase the cost. It is to be noted that the two IF bands converted at the two different local oscillators 209 and 210 are in the ranges of 950 MHz–1450 MHz and 1550 MHz–2050 MHz, respectively, and the guard band frequency band therebetween is 1450 MHz–1550 MHz. In other words, this guard band is 100 MHz, which is narrow. In order to take advantage of this guard band frequency band at LPF 13 and HPF 14 prior to obtaining signals of respective IF bands to suppress the noise level of one IF band from affecting the other frequency band, an LPF and an HPF superior in cut-off characteristics will be required. Such requirements will increase the cost.

In the second conventional LNB of FIG. 15, the frequency difference of the local oscillation signals output from local oscillators 209A and 210A is 3.1 GHz, and a fourfold harmonic component thereof is 12.4 GHz, This becomes a spurious harmonic component for a signal of 12.2–12.7 GHz received from a satellite, acting as an interference wave with respect to a reception signal of 12.4 GHz. To suppress such a wave, the two local oscillators 209A and 210A or mixers 11 and 12 must be subjected to some measures such as shield enhancement, likewise the first conventional LNB. Thus, the cost will be increased.

SUMMARY OF THE INVENTION

In view of the foregoing, a main object of the present invention is to provide a low noise converter of low cost and of high performance property, less susceptible to a spurious harmonic component.

According to an aspect of the present invention, a low noise converter receiving first and second polarization signals present in a first frequency band, and converting the received first and second polarization signal into first and second intermediate frequency signals, respectively, for output, includes: first and second local oscillation circuits providing a first local oscillation signal having a first frequency and a second local oscillation signal having a second frequency, respectively; first and second mixer circuits mixing the first and second polarization signals with the first and second local oscillation signals, respectively, and providing the mixed signals as third and fourth intermediate frequency signals, respectively; and first and second signal filters passing the third and fourth intermediate frequency signals through a second frequency band and a third frequency band higher than the second frequency band, respectively, and providing the passed signals as first and second intermediate frequency signals, respectively. The first and second local oscillation circuits determine the first and second frequencies so that a frequency of n times (n is a natural number) a first frequency difference between the first and second frequencies is not present in the first to third frequency bands.

Accordingly, a spurious harmonic generated by the frequency difference between two local oscillation signals will not be present in the frequency band of an input signal (polarization signal) and an intermediate frequency signal in an ideal situation. It is therefore not necessary to enhance the shield to reduce the influence of spurious harmonics. A low noise converter of a simple structure can be realized.

Preferably, a second frequency difference between the lowest frequency in the third frequency band and the highest frequency in the second frequency band is at least a predetermined frequency.

Preferably, the predetermined frequency is 200 MHz.

Since a guard band of at least the predetermined frequency is ensured, it is not necessary to employ first and second signal filters having abrupt cut-off characteristics. Therefore, the cost for signal filters can be reduced.

Preferably, the first frequency band is in the range of 11.7 GHz–12.2 GHz. The first and second frequencies are 10.75 GHz and 13.85 GHz, respectively. The second and third frequency bands are in the range of 950 MHz–1450 MHz and the range of 1650–2150 MHz, respectively.

Preferably, the first frequency band is in the range of 11.7 GHz–12.2 GHz. The first and second frequencies are present in the frequency band of 10.750 GHz–10.799 GHz and the frequency band of 13.850 GHz–13.801 GHz, respectively. The second and third frequency bands are in the range of 950 MHz–1450 MHz and the range of 1650–2150 MHz, respectively.

Preferably, each of the first and second mixer circuits includes an active mixer including an active device.

Preferably, each of the first and second mixer circuits includes a diode mixer.

Preferably, each of the first and second local oscillation circuits includes a dielectric oscillator.

Preferably, the oscillation device of the dielectric oscillator includes a silicon bipolar transistor.

Preferably, each of the first and second signal filters includes a dielectric filter.

Preferably, the low noise converter further includes a combine circuit receiving first and second intermediate frequency signals from first and second signal filters, respectively, and combining the received first and second intermediate frequency signals to output a fifth intermediate frequency signal.

Preferably, the combine circuit is a Y type distribution circuit. The Y type distribution circuit is formed of a distributed constant circuit with coupled microstrip lines each having a length of ¼ the effective wavelength.

Preferably, the combine circuit is a Y type distribution circuit. The Y type distribution circuit is formed of a chip inductor with an appropriate constant.

Preferably, the low noise converter further includes first and second input terminals receiving first and second polarization signals, respectively, first and second low noise amplifiers amplifying first and second polarization signals received at the first and second input terminals, respectively, first and second band pass filters passing first and second polarization signals amplified by the first and second low noise amplifiers, respectively, through a predetermined frequency band, and providing the passed first and second polarization signals to first and second mixer circuits, respectively, and an intermediate frequency amplify circuit amplifying a fifth intermediate frequency signal output from the combine circuit.

According to the present invention, a receiver apparatus includes any of the low noise converter described above.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
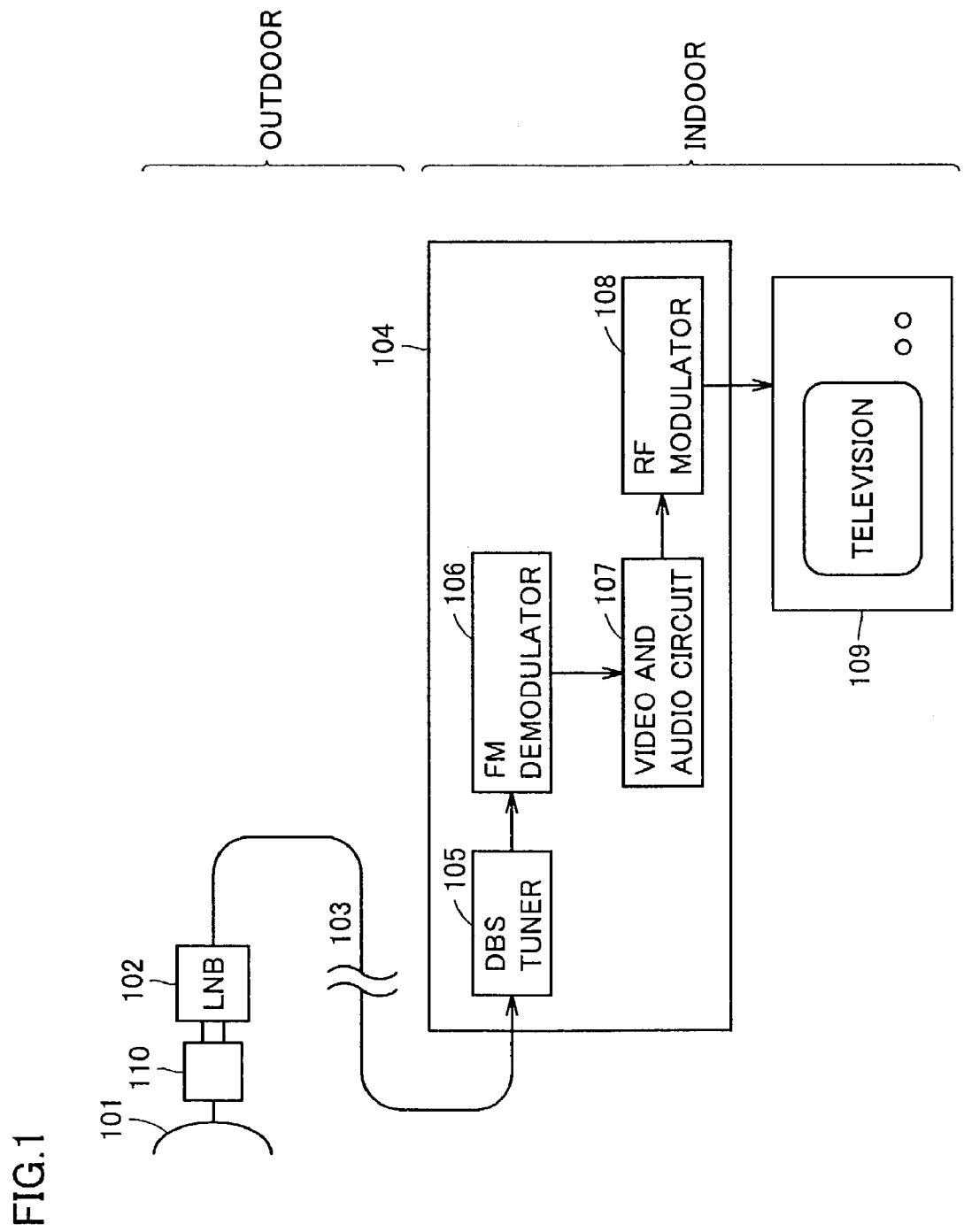
FIG. 1 is a schematic block diagram showing an entire structure of a satellite broadcast reception system in which an LNB of the present invention is employed.

Embodiments of the present invention will be described in detail hereinafter with reference to the drawings. In the drawings, the same or corresponding components have the same reference characters allotted, and description thereof will not be repeated.

FIG. 1 is a schematic block diagram of an entire structure of a satellite broadcast reception system in which an LNB of the present invention is employed. Referring to FIG. 1, an antenna 101 is attached with a feed horn and a cross polarization separator 110 at a succeeding stage. An LNB 102 is a portion of an element called "outdoor" of the present system, and is attached at a succeeding stage of cross polarization separator 110. LNB 102 amplifies a weak wave from a satellite with low noise to supply a signal of low noise and sufficient level to a connected indoor receiver 104 via a coaxial cable 103.

Indoor receiver 104 includes a DBS tuner 105, an FM demodulator 106, a video and audio circuit 107, and an RF modulator 108. A signal applied from coaxial cable 103 is processed by these circuits to be provided to a television set 109.

Figure 2:
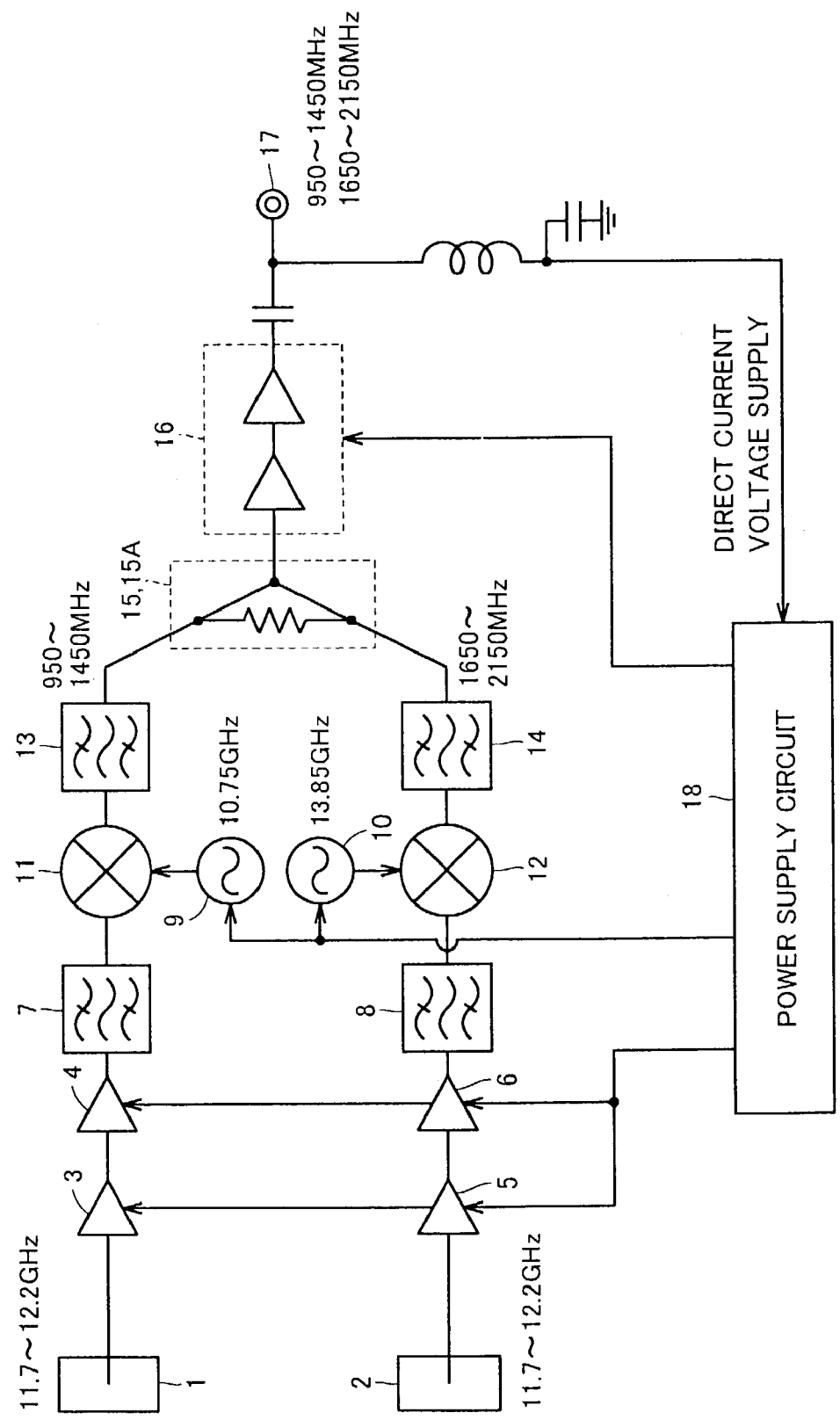
FIG. 2 is a block diagram of an LNB according to an embodiment of the present invention.

FIG. 2 is a block diagram of an LNB according to an embodiment of the present invention. Referring to FIG. 2, the received signals of horizontal polarization and vertical polarization are applied via input terminals 1 and 2, respectively, to low noise amplifiers 3–6 formed of HEMT (High Electron Mobility Transistor) devices to be amplified with low noise, and then transmitted to BPFs (Band Pass Filter)

7 and 8 to have the signal in the image frequency band suppressed. This filter is formed of a microstrip line as a distribution constant circuit on a circuit substrate. A half-wave filter, for example, is often employed.

The circuit substrate is a substrate with copper foil at both sides, called a Teflon® substrate, exhibiting low loss (dielectric loss δ=approximately 0.002) at the 12 GHz band and a dielectric constant of approximately 2.6. Copper foil is provided all over the back side opposite to the side where components are located. A distributed constant circuit can be formed by the aforementioned microstrip line.

The RF signal of 12 GHz band is transmitted to mixers 11 and 12 to be converted into an IF signal of the band of 1–2 GHz. Mixers 11 and 12 may be active mixers formed of HEMT, FET, and the like, or diode mixers formed of Schottky diodes. Local oscillators 9 and 10 provide local oscillation signals for frequency conversion to the mixers. Local oscillators 9 and 10 are oscillation circuits called dielectric oscillators. One of local oscillators 9 and 10 has an oscillating frequency of 10.75 GHz whereas the other has an oscillating frequency of 13.85 GHz. Both frequencies can be provided by a direct oscillator employing a dielectric resonator. The oscillator device may be an HEMT, FET, silicon transistor, HBT, and the like.

The IF signal output from mixer 11 is transmitted to a low pass filter 13 for output of an IF band signal of 950–1450 MHz. The IF signal from mixer 12 is transmitted to a high pass filter 14 for output of an IF band signal of 1650–2150 MHz.

Each IF band signal output from LPF 13 and HPF 14 is combined at Y type distribution circuit 15 that is a combined circuit, applied to an IF amplifier 16 to be amplified, and then output from IF output terminal 17.

In the present embodiment, the frequency difference of the local oscillation signals output from local oscillators 9 and 10 is 13.85 GHz–10.75 GHz=3.1 GHz. The twofold, threefold, and fourfold harmonic components thereof become 6.2 GHz, 9.3 GHz and 12.4 GHz, respectively, and are not present in the IF band of 950–1450 MHz nor in the reception band of 11.7 GHz–12.2 GHz. Therefore, a spurious harmonic component will not be generated in the band. As to the shields of the two local oscillators 9 and 10 and the two mixers 11 and 12, generation of spurious harmonic components do not have to be taken into account. Therefore, an LNB of low cost can be realized.

The IF band is in the range of 950 MHz–1450 MHz and the range of 1650 MHz–2150 MHz. The guard band is in the range of 1450 MHz–1650 MHz. Therefore, LPF 13 and HPF 14 do not require abrupt cut-off to suppress the noise level from affecting the other IF band, as compared to the conventional case. Therefore, implementation is facilitated. Accordingly, economic high pass and low pass filters can be employed.

Figure 3:
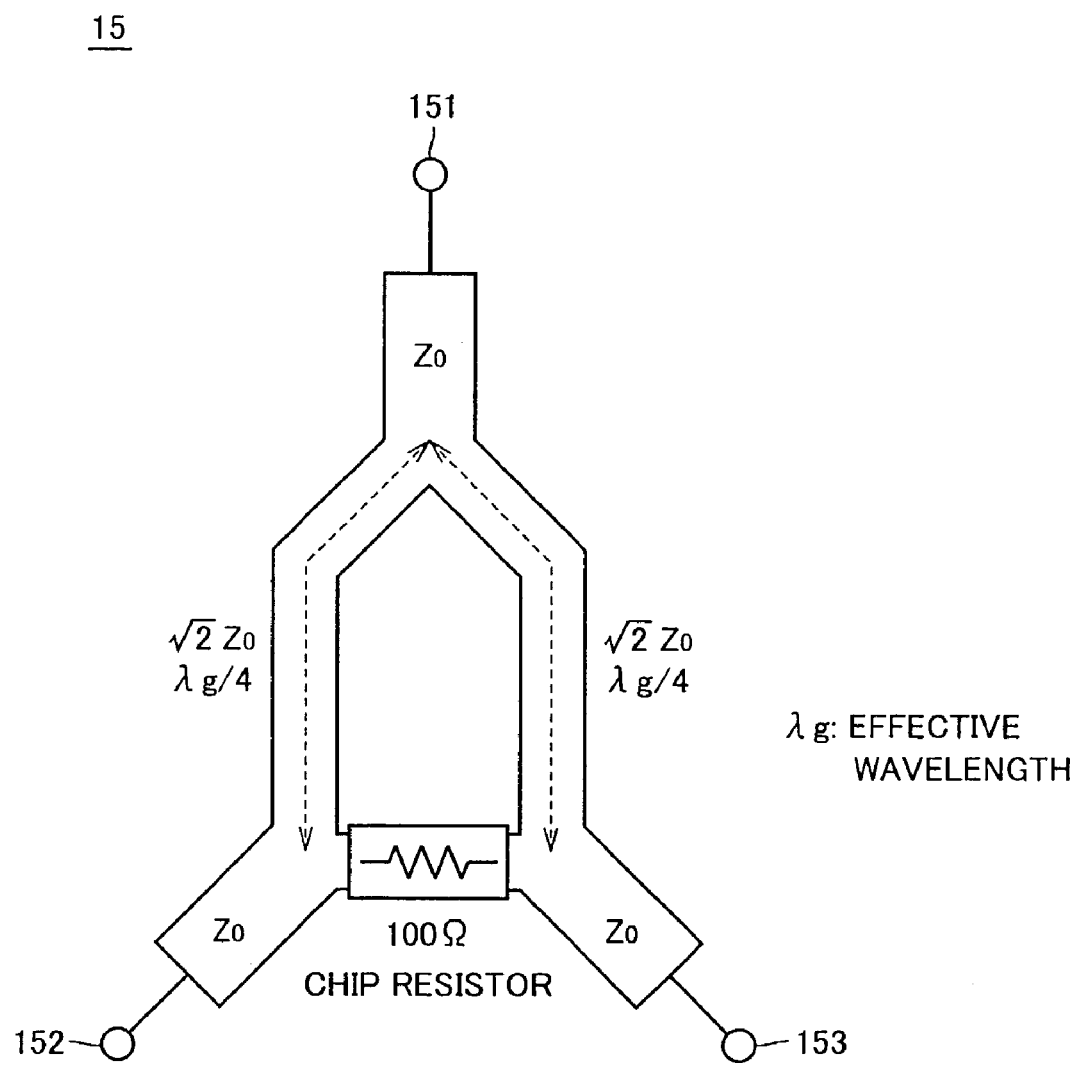
FIG. 3 shows a Y type distribution circuit of FIG. 2.

FIG. 3 shows a structure of a Y type distribution circuit 15 as a combine circuit shown in FIG. 2. Y type distribution circuit 15 is formed of a Y-shaped microstrip line having a length of ¼ effective wavelength λg and an impedance of $\sqrt{2}Z_0$. Y type distribution circuit 15 combines the IF band signals applied through ports 152 and 153 from mixers 11 and 12 to output a combined signal from a port 151. A chip resistor of 100 Ω is connected between ports 152 and 153. The configuration thereof is not limited to that shown in FIG. 3, depending on the length.

The IF band signal output from port 151 of Y type distribution circuit 15 shown in FIG. 3 is transmitted to IF amplifier 16 to have the signal level amplified to an appropriate level.

Figure 4:
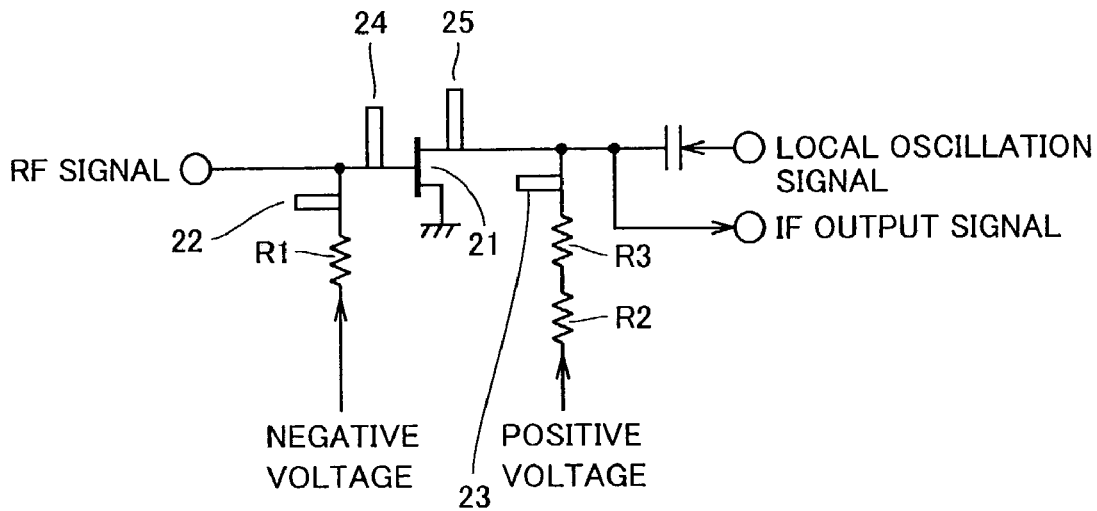
FIG. 4 is a circuit diagram of an active mixer employed in a mixer of FIG. 2.

FIG. 4 is a circuit diagram of an active mixer employed as the mixer of FIG. 2. Referring to FIG. 4, a semiconductor element 21 is formed by an HEMT or FET, having an RF signal input at its gate terminal, and applied with a negative voltage via resistor R1. Semiconductor element 21 receives a local oscillation signal at its drain terminal, and outputs an IF signal from the drain thereof. A positive voltage is supplied via resistors R2 and R3. At a negative voltage supply line and a positive voltage supply line, microstrip line stubs 22 and 23 for stopping an RF signal are provided. At the RF signal line and local oscillation signal line, microstrip line stubs 24 and 25 for adjusting the mixer property are provided.

In order to obtain the optimum conversion output at the active mixer of FIG. 4, the length and thickness of gate terminals stubs 22 and 24 and drain stubs 23 and 25 as well as the gate negative voltage value are adjusted. The positive voltage of the drain terminal is set to a constant 2V, for example. The active mixer can have the conversion gain of 4–2 dB, differing from a diode mixer.

Figure 5:
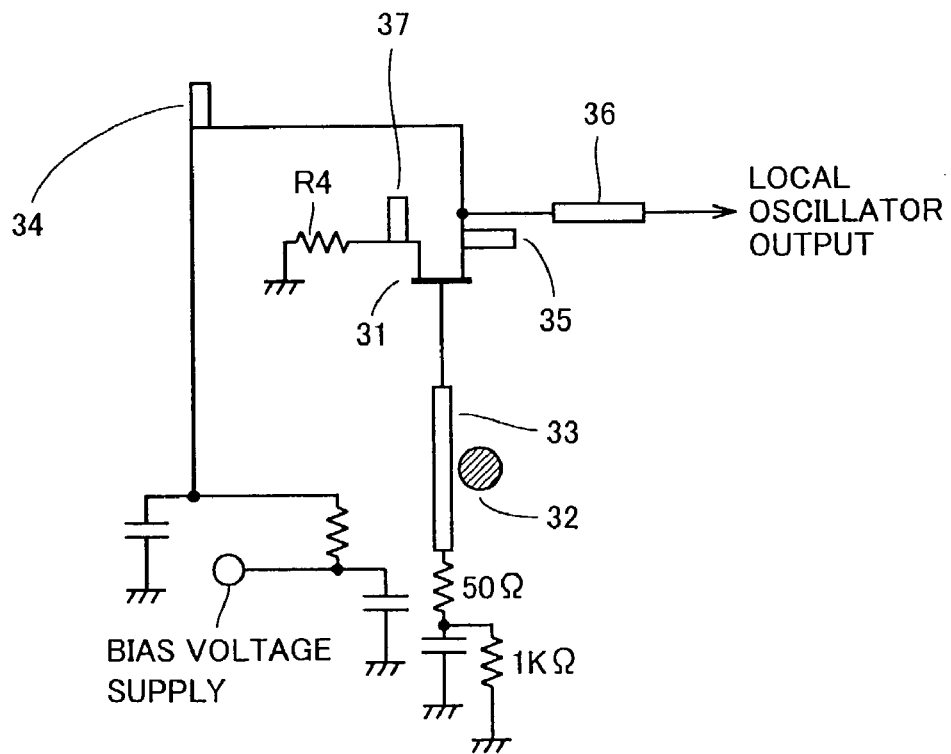
FIG. 5 shows an example of a dielectric oscillator.

FIG. 5 shows a dielectric oscillator employed as the local oscillator of FIG. 2. Referring to FIG. 5, an oscillation device 31 is a band reflex oscillator formed of an HEMT or FET. A dielectric resonator 32 having a high Q factor (at least 3000, dielectric constant at least 30) is coupled to a microstrip line 33 for coupling line coupled to the gate of oscillation device 31. A bias voltage is supplied to the drain of oscillation device 31 via a microstrip line 34 for stopping a local oscillator output. At that line, a microstrip line stub 35 for adjusting the oscillation property is provided.

Oscillation device 31 has its drain connected to a microstrip line 36 for a local oscillator output, from which an output from the local oscillator is provided. Oscillation device 31 has its source connected to a bias resistor R4 via a microstrip line 37 for stopping a local oscillator output.

The dielectric oscillator of FIG. 5 conducts oscillation by coupling dielectric resonator 32 with microstrip line 33. The oscillation property can be optimized by the coupled position as well as the length and thickness of microstrip line stub 35 coupled to the drain.

Figure 6:
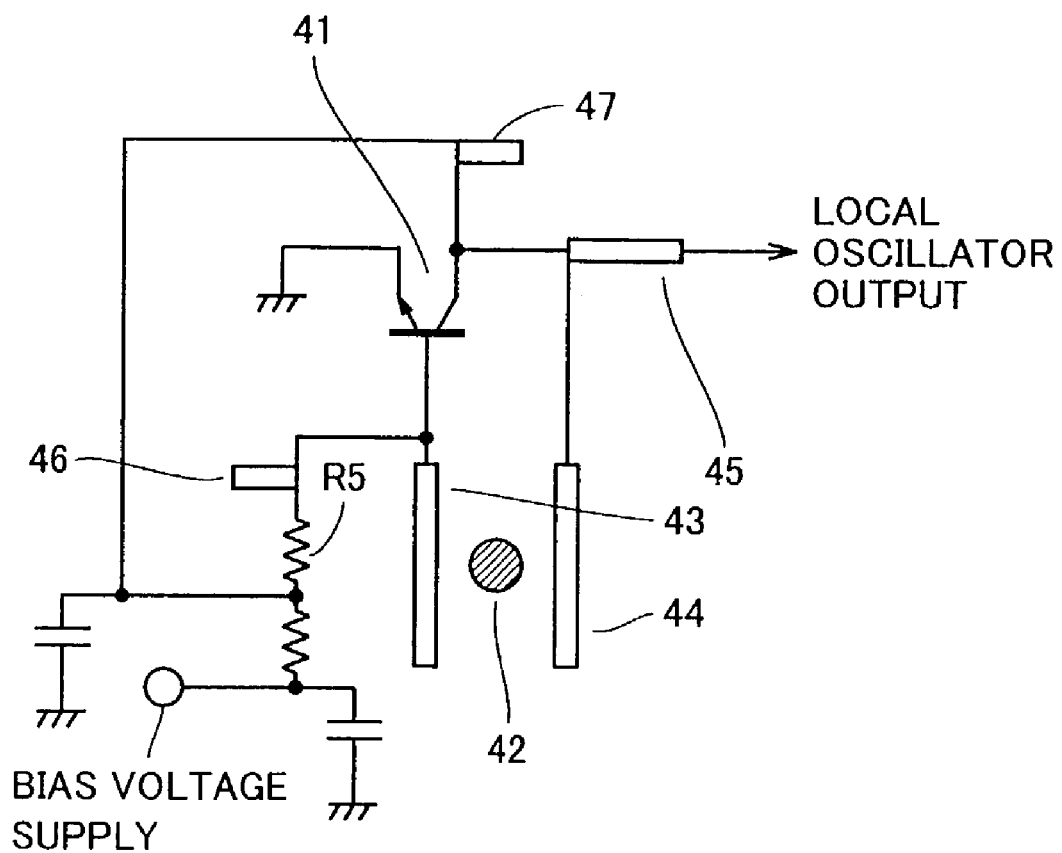
FIG. 6 shows an example of an oscillator formed of a silicon bipolar transistor.

FIG. 6 is a circuit diagram showing another example of a local oscillator. Here, a silicon bipolar transistor 41 is employed as an oscillator device. The Ft (high frequency characteristic) of silicon bipolar transistor 41 has now extended up to the 30 GHz band, so that oscillation at 10–15 GHz can now be realized without employing an HEMT or FET. The present local oscillator is advantageous in that phase noise characteristics superior than that of HEMT or FET can be achieved by virtue of the silicon device.

As shown in FIG. 6, transistor 41 has its base coupled to a dielectric resonator 42 through a microstrip line 43 for coupling line, and has its collector coupled to dielectric resonator 42 via a microstrip line 44 for coupling line. The base of transistor 41 receives a bias voltage via resistor R5, and is provided with a microstrip line 46 for stopping a local oscillator output. Transistor 41 has its collector connected to a microstrip line 45 for coupling line to provide an output from the local oscillator, and to a microstrip line 47 for stopping a local oscillator output so that the output of the local oscillator does not leak towards the base.

The oscillator of FIG. 6 conducts oscillation by the coupling of microstrip lines 43 and 44 connected to the base and collector, respectively, of transistor 41, and dielectric resonator 42.

Figure 7:
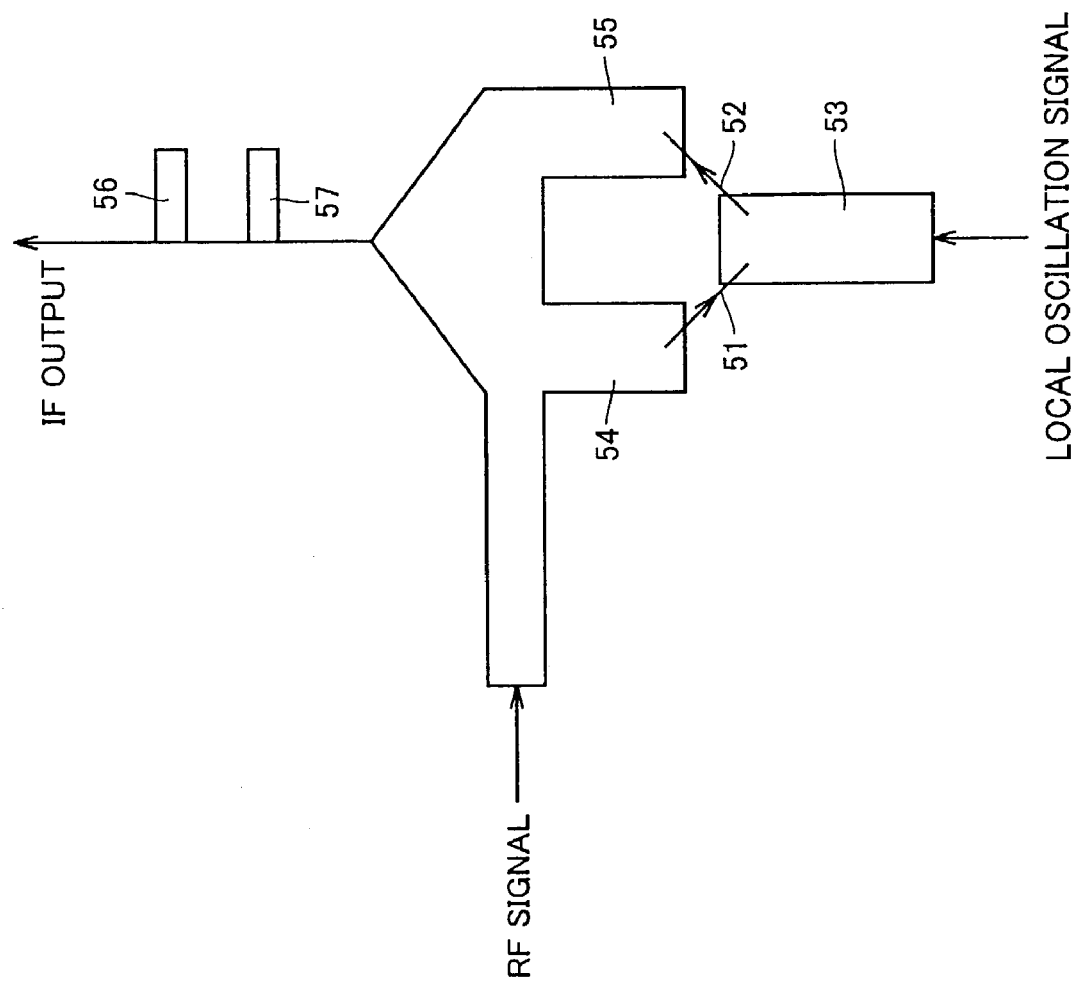
FIG. 7 shows a structure of a diode mixer that can be employed as the mixer of FIG. 2.

FIG. 7 shows a structure of a diode mixer that can be employed as the mixer of FIG. 2. The diode mixer of FIG.

7 is called a single end mixer employing Schottky diodes 51 and 52. Conversion loss is approximately 68 dB.

The local oscillation signal is applied via a microstrip line 53 to the anode of Schottky diode 51 and the cathode of Schottky diode 52. The anode of Schottky diode 51 is connected to a microstrip line 54 to which a high frequency (RF) signal is applied. The cathode of Schottky diode 52 is connected to a microstrip line 55 from which an IF signal is output. This IF signal output line is provided with stubs 56 and 57 to prevent the output of an RF signal.

In the present example, a local oscillation signal is mixed with a high frequency signal by the functions of Schottky diodes 51 and 52 for the output of an IF signal.

Figure 8:
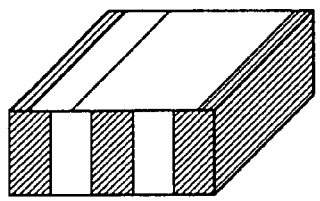
FIG. 8 is a perspective view of a dielectric filter.
Figure 9:
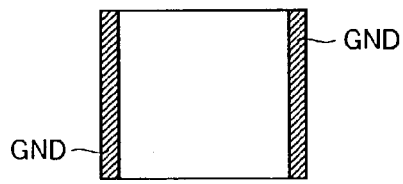
FIGS. 9, 10, 11 and 12 are a plan view, side views, and a plan view of the dielectric filter of FIG. 8 viewed from above, the front, the side, and the bottom, respectively.
Figure 10:
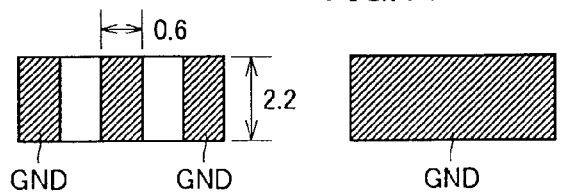
Figure 11:
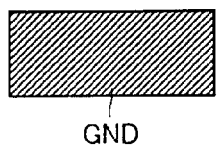
Figure 12:
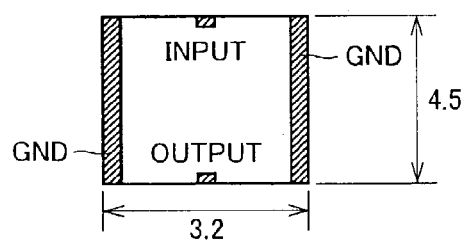

FIGS. 8–12 show examples of a dielectric filter. FIG. 8 is a perspective view of a dielectric filter. FIG. 9 is a plan view of the dielectric filter of FIG. 8, viewed from above. FIG. 10 is a side view of the dielectric filter of FIG. 8, viewed from the front. FIG. 11 is a side view of the dielectric filter of FIG. 8, viewed from the side. FIG. 12 is a plan view of the dielectric filter of FIG. 8, viewed from the bottom. The dielectric filter is a chip stacked type filter applied to LPF 13 and HPF 14 of FIG. 2. The main specification of this filter is set forth below.

Low Pass Filter LPF 13

Nominal impedance: 50 Ω; nominal center frequency: 1200 MHz; pass band: 950–1450 MHz; insertion loss: 2.0 dB maximum; in-band deviation (ripple): 1.0 dB maximum; (25 MHz ripple): 0.4 dB maximum; VSWR: 2.0 maximum; guard band attenuation: 27 dB minimum (1650–2150 MHz).

High Pass Filter HPF 14

Nominal impedance: 50 Ω; nominal center frequency: 1900 MHz; pass band: 1650–2150 MHz; insertion loss: 2.0 dB maximum; in-band deviation (ripple): 1.0 dB maximum; (25 MHz ripple): 0.4 dB maximum; VSWR: 2.0 maximum; guard band attenuation: 30 dB minimum (950–1450 MHz).

The filter is formed of the materials of, for example, barium oxide-titanium oxide based dielectric ceramic composition for the main unit, a silver electrode for the internal conductor, and silver-platinum for the external electrode terminal. The shape is a square chip stacked layer of 4.5×3.2×2.2. Therefore, mounting on the substrate and soldering by reflowing are allowed to realize a compact filter.

Figure 13:
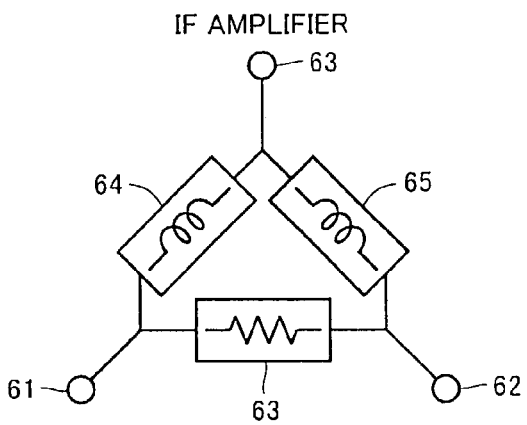
FIG. 13 shows an example of a Y type distribution circuit formed of a chip inductor.
Figure 14:
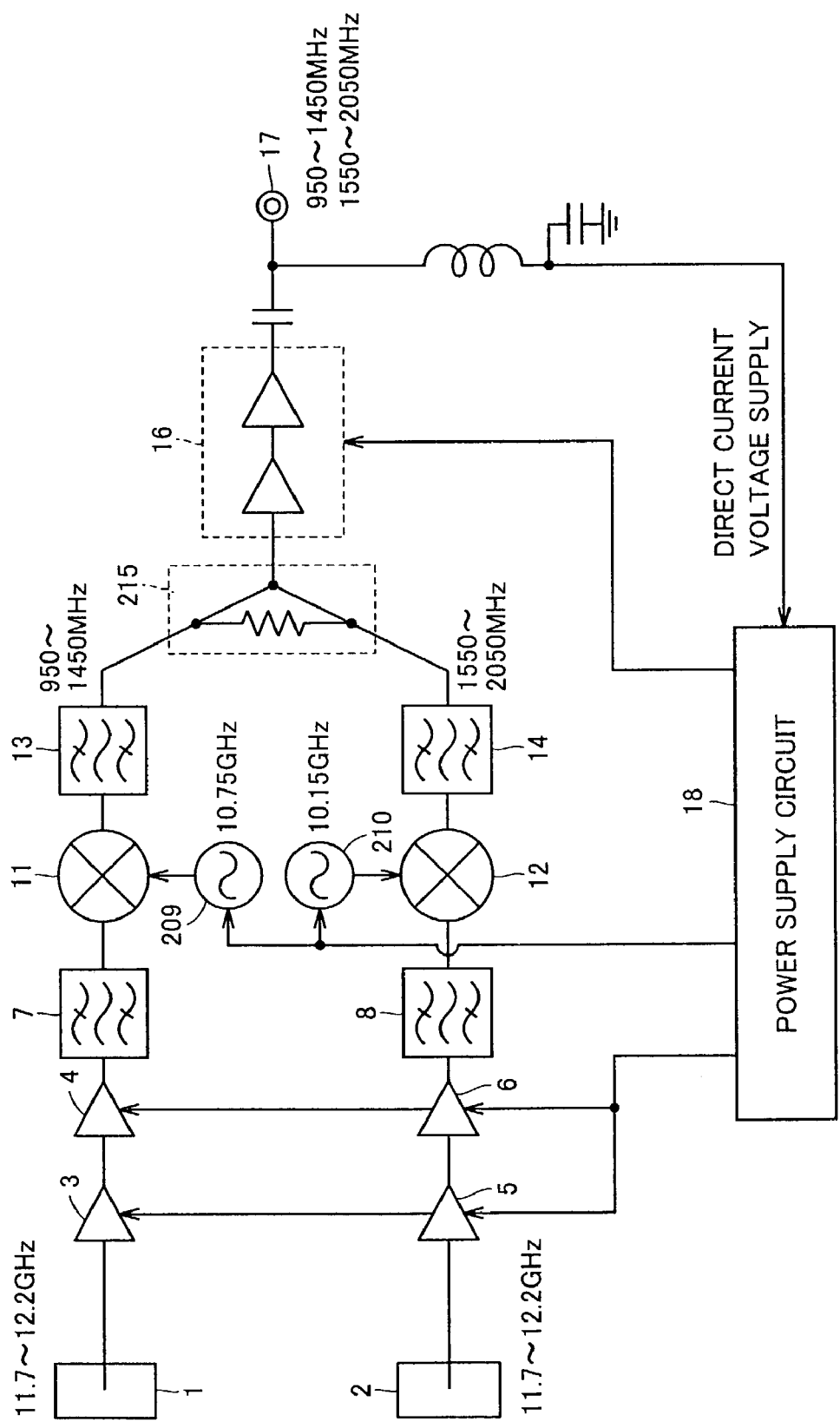
FIG. 14 is a block diagram showing a first conventional LNB.
Figure 15:
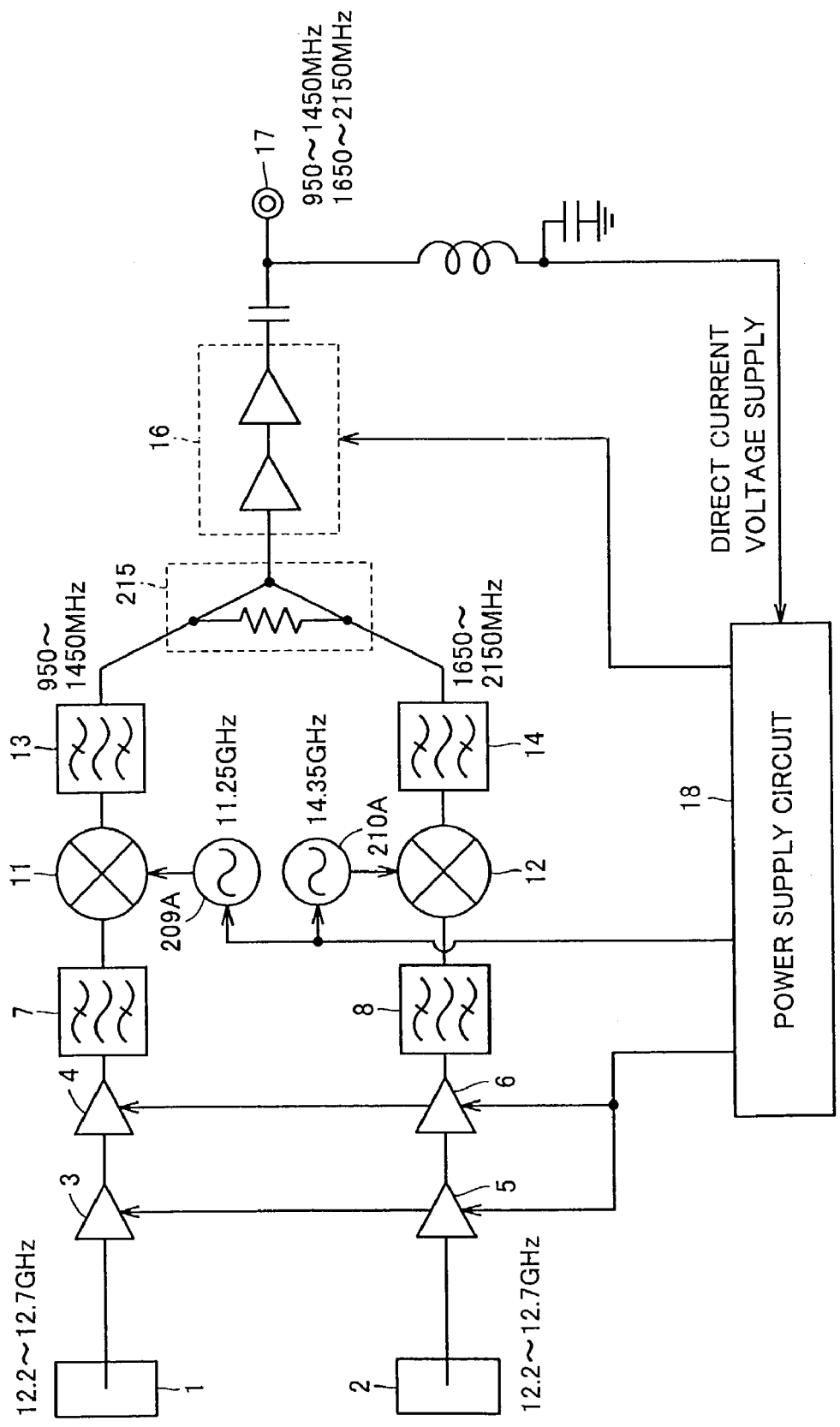
FIG. 15 is a block diagram of a second conventional LNB.

FIG. 13 shows an example of a Y type distribution circuit 15A formed of a chip inductor. Y type distribution circuit 15 shown in FIG. 3 may be increased in configuration since a microstrip line that has a length of ¼ the effective wavelength is required. Y type distribution circuit 15A of FIG. 13 is directed to render the entire configuration compact by including chip inductors 64 and 65 instead of microstrip lines, between ports 61 and 62 and port 63.

As another embodiment, local oscillators 9A and 9B can be provided instead of local oscillators 9 and 10 of FIG. 2. Local oscillator 9A oscillates at the frequency between 10.750–10.799 GHz whereas local oscillator 10A oscillates at the frequency between 13.850–13.801 GHz.

Although the guard band becomes as narrow as 151 MHz from 200 MHz, there will be no inclusion of a spurious signal in the band. Therefore, no spurious harmonic component will be generated in the band.

Although two polarization signals are input in the present embodiment, three or more polarization signals may be input instead. In this case, a plurality of local oscillators, a plurality of mixer circuits, and a plurality of signal filters are provided corresponding to the number of input polarization signals. A plurality of intermediate frequency signals corresponding to the number of the input polarization signals will be generated. The oscillating frequency of the plurality of local oscillators are to be determined so that the frequency difference between two arbitrary local oscillators among the plurality of local oscillators as well as the frequency of harmonic component of n times (n is a natural number) of the frequency difference thereof are not present in the frequency band of the polarization signal and each frequency band of the plurality of intermediate frequency signals.

Although not particularly shown, the LNB can further include a plurality of PLL circuits provided corresponding to the plurality of local oscillators to control the oscillating frequency of a corresponding local oscillator, and a control circuit setting the oscillating frequency of each PLL circuit. The oscillating frequency of the plurality of local oscillators can be calculated by the control circuit. The calculated oscillating frequency can be set at each PLL circuit.

Specifically, the control circuit obtains the frequency band of a received polarization signal and the frequency band of a plurality of output intermediate frequency signals, and determines by calculation the oscillating frequency of each local oscillator so that the frequency difference between two arbitrary local oscillators among the plurality of local oscillators and the frequency of harmonic component of n times (n is a natural number) the frequency difference thereof are not present in the frequency band of the polarization signal and each frequency band of the plurality of intermediate frequency signals. The determined oscillating frequency is set at each PLL circuit.

Accordingly, the oscillating frequency of a plurality of local oscillator can be set appropriately according to the frequency band of a received polarization signal and a plurality of output intermediate frequency signals.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A low noise converter receiving first and second polarization signals present in a first frequency band, converting said received first and second polarization signals into first and second intermediate frequency signals, respectively, and outputting said first and second intermediate frequency signals, comprising:

first and second local oscillation circuits providing a first local oscillation signal having a first frequency and a second local oscillation signal having a second frequency, respectively;

first and second mixer circuits mixing said first and second polarization signals with said first and second local oscillation signals, respectively, and outputting the mixed signals as third and fourth intermediate frequency signals, respectively; and first and second signal filters passing said third and fourth intermediate frequency signals through a second frequency band and a third frequency band, respectively, said third frequency band being higher than said second frequency band, and providing the passed signals as said first and second intermediate frequency signals, respectively, wherein said first and second local oscillation circuits determine said first and second frequencies so that a frequency of n times a first frequency difference between said first and second frequencies is not present in said first to third frequency bands, wherein n includes all natural numbers.

2. The low noise converter according to claim 1, wherein a second frequency difference between a lowest frequency in said third frequency band and a highest frequency in said second frequency band is at least a predetermined frequency.

3. The low noise converter according to claim 2, wherein said predetermined frequency is 200 MHz.

4. The low noise converter according to claim 1, wherein
said first frequency band is in a range of 11.7 GHz 12.2 GHz,
said first and second frequencies are 10.75 GHz and 13.85GHz, respectively, and
said second and third frequency bands are in a range of 950 MHz–1450 MHz, and a range of 1650 MHz–2150 MHz, respectively.

5. The low noise converter according to claim 1, wherein
said first frequency band is in a range of 11.7 GHz 12.2 GHz,
said first and second frequencies are present in a frequency band of 10.750 GHz–10.799 GHz and a frequency band of 13.850 GHz–13.801 GHz, respectively, and
said second and third frequency bands are in a range of 950 MHz–1450 MHz, and a range of 1650 MHz–2150 MHz, respectively.

6. The low noise converter according to claim 1, wherein each of said first and second mixer circuits comprises an active mixer including an active device.

7. The low noise converter according to claim 1, wherein each of said first and second mixer circuits includes a diode mixer.

8. The low noise converter according to claim 1, wherein each of said first and second local oscillation circuits includes a dielectric oscillator.

9. The low noise converter according to claim 8, wherein an oscillation device of said dielectric oscillator includes a silicon bipolar transistor.

10. The low noise converter according to claim 1, wherein each of said first and second signal filters includes a dielectric filter.

11. The low noise converter according to claim 1, further comprising a combine circuit receiving said first and second intermediate frequency signals from said first and second signal filters, respectively, and combining the received first and second intermediate frequency signals to output a fifth intermediate frequency signal.

12. The low noise converter according to claim 11, wherein said combine circuit includes a Y type distribution circuit,
wherein said Y type distribution circuit is formed of a distributed constant circuit with coupled microstrip lines each having a length of ¼ the effective wavelength.

13. The low noise converter according to claim 11, wherein said combine circuit includes a Y type distribution circuit,
wherein said Y type distribution circuit is formed of a chip inductor with an appropriate constant.

14. The low noise converter according to claim 11, further comprising:
first and second input terminals receiving said first and second polarization signals, respectively;
first and second low noise amplifiers amplifying said first and second polarization signals received at said first and second input terminals, respectively;
first and second band pass filters passing said first and second polarization signals amplified by said first and second low noise amplifiers, respectively, through a predetermined frequency band and providing the passed first and second polarization signals to said first and second mixer circuits, respectively; and
an intermediate frequency amplify circuit amplifying said fifth intermediate frequency signal output from said combine circuit.

15. A receiver apparatus comprising a low noise converter receiving first and second polarization signals present in a first frequency band, converting said received first and second polarization signals into first and second intermediate frequency signals, respectively, and outputting said first and second intermediate frequency signals, wherein
said low noise converter includes:
first and second local oscillation circuits providing a first local oscillation signal having a first frequency and a second local oscillation signal having a second frequency, respectively;
first and second mixer circuits mixing said first and second polarization signals with said first and second local oscillation signals, respectively, and outputting the mixed signals as third and fourth intermediate frequency signals, respectively; and
first and second signal filters passing said third and fourth intermediate frequency signals through a second frequency band and a third frequency band, respectively, said third frequency band being higher than said second frequency band, and providing the passed signals as said first and second intermediate frequency signals, respectively,
said first and second local oscillation circuits determine said first and second frequencies so that a frequency of n times a first frequency difference between said first and second frequencies is not present in said first to third frequency bands,
wherein n includes all natural numbers.

16. A receiver, apparatus according to claim 15, wherein a second frequency difference between a lowest frequency in said third frequency band and a highest frequency in said second frequency band is at least a predetermined frequency.

17. A receiver apparatus according to claim 16, wherein said predetermined frequency is 200 MHz.

18. A receiver apparatus according to claim 15, wherein
said first frequency band is in a range of 11.7 GHz 12.2 GHz,
said first and second frequencies are 10.75 GHz and 13.85 GHz, respectively, and
said second and third frequency bands are in a range of 950 MHz–1450 MHz, and a range of 1650 MHz–2150 MHz, respectively.

19. A receiver apparatus according to claim 15, wherein
said first frequency band is in a range of 11.7 GHz 12.2 GHz,
said first and second frequencies are present in a frequency band of 10.750 GHz–10.799 GHz and a frequency band of 13.850 GHz–13.801 GHz, respectively, and
said second and third frequency bands are in a range of 950 MHz–1450 MHz, and a range of 1650 MHz–2150 MHz, respectively.

20. A receiver apparatus according to claim 15, wherein said low noise converter further includes a combine circuit receiving said first and second intermediate frequency signals from said first and second signal filters, respectively, and combining the received first and second intermediate frequency signals to output a fifth intermediate frequency signal.

* * * * *